(12) United States Patent
Tang et al.

(10) Patent No.: US 7,088,144 B2
(45) Date of Patent: Aug. 8, 2006

(54) CONDITIONAL PRECHARGE DESIGN IN STATICIZED DYNAMIC FLIP-FLOP WITH CLOCK ENABLE

(75) Inventors: Bo Tang, Fremont, CA (US); Edgardo F. Klass, Palo Alto, CA (US); Geoffrey M. Pilling, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 81 days.

(21) Appl. No.: 10/937,985

(22) Filed: Sep. 10, 2004

(65) Prior Publication Data

US 2006/0055427 A1    Mar. 16, 2006

(51) Int. Cl.
H03K 19/20   (2006.01)
H03K 19/082  (2006.01)
H03K 19/00   (2006.01)
H03K 19/096  (2006.01)

(52) U.S. Cl. ............... 326/119; 326/93; 326/94; 326/95; 326/96; 326/97; 326/98; 326/112; 326/121

(58) Field of Classification Search ............ 326/93–98, 326/112, 119, 121
See application file for complete search history.

(56) References Cited

U.S. PATENT DOCUMENTS

| 5,898,330 | A  | * | 4/1999  | Klass ........................ 327/210 |
| 6,222,404 | B1 | * | 4/2001  | Mehta et al. ............... 327/200 |
| 6,424,195 | B1 | * | 7/2002  | Samala ...................... 327/211 |
| 6,429,689 | B1 |   | 8/2002  | Allen et al. ................. 326/95 |
| 6,646,487 | B1 |   | 11/2003 | Nedovic et al. ............ 327/211 |
| 6,654,893 | B1 | * | 11/2003 | Samala ...................... 713/300 |
| 6,879,186 | B1 | * | 4/2005  | Liu ............................. 326/98 |

* cited by examiner

Primary Examiner—Rexford Barnie
Assistant Examiner—Dylan White
(74) Attorney, Agent, or Firm—Gunnison, McKay & Hodgson, L.L.P.; Philip J. McKay

(57) ABSTRACT

A method and apparatus for creating a modified dynamic flip-flop avoids the power waste created by prior art dynamic flip-flops by including a conditional pre-charge control circuit and method. When the modified dynamic flip-flop is in a holding mode, i.e., in the clock disable state, the modified dynamic flip-flop does not use power pre-charging and discharging the internal dynamic node every cycle.

6 Claims, 3 Drawing Sheets

CONDITIONAL PRECHARGE DESIGN IN STATICIZED DYNAMIC FLIP-FLOP WITH CLOCK ENABLE

FIELD OF THE INVENTION

The present invention relates generally to logic circuits and, more particularly, to flip-flop circuits and designs.

BACKGROUND OF THE INVENTION

Electronic components such as computers, Personal Digital Assistants (PDAs), cellular telephones, video display and processing devices, and various other electronic systems are now considered essential for day-to-day life and consumers insist that these devices be portable enough to accompany them wherever they go. This places two important demands on the electronics industry: smaller devices and longer battery life. Unfortunately, these two demands are at odds with each other since longer battery life typically means bigger batteries and therefore bigger devices. Other than increasing battery size, the only way to increase battery life is to decrease power consumption. Consequently there is a strong demand in the electronics industry for lower power consumption, which, in turn, allows smaller batteries for the same device operating time.

In addition, the other limiting factor in current electronics design is heat dissipation. Here again, power consumption is central since the key to generating less heat is using less power. Consequently, the minimization of power usage is an important factor in virtually all-new electronic designs and power usage/waste that was considered acceptable in the prior art is no longer being tolerated.

One area where power usage/waste was tolerated in the prior art, mostly because no solution to the power waste was ever offered, is in dynamic flip-flops. Since a significant amount of power in modern electronic devices is used to operate the flip-flops, which can easily number in the thousands and hundreds of thousands in a single device, the power wasted in prior art dynamic flip-flop circuits was non-trivial and a very real concern.

Dynamic flip-flops and their operation are well known to those of skill in the art. Consequently, a detailed discussion of the operation and structure of a specific prior art dynamic flip-flops is not included here to avoid detracting from the present invention. However, a brief summary of the key points of prior art dynamic flip-flops is provided to clarify the structure and advantages of the present invention.

In prior art dynamic flip-flops, dynamic nodes were pre-charged each clock cycle to provide high speed operation once data was captured, i.e., the dynamic node was pre-charged so that once data arrived flop can do evaluation by discharging this node or keeping the charges depending on the incoming data just like the general dynamic logic circuits. Many prior art dynamic flip-flops also included a Clock Enable (CE) function, which made multiple cycle paths possible in digital circuits. When prior art dynamic flip-flops were in a holding mode, i.e., in the clock disable state, prior art dynamic flip-flops kept the previous data from feedback path, i.e., there was no change in the data and there were no output toggles. Using prior art dynamic flip-flops, if previous data was "high", or a digital one, the prior art dynamic flip-flops kept pre-charging and discharging the internal dynamic node every cycle. However, since the data, by definition, was not changing, significant power was wasted in this pre-charging and discharging the internal dynamic node each cycle. Of course, the more cycles digital "1" was held, the more power was wasted. Consequently, prior art dynamic flip-flops used power unnecessarily.

FIG. 1 shows an exemplary timing diagram 100 for a typical prior art dynamic flip-flop (not shown). An L1 clock signal L1CLK 101 for a typical prior art dynamic flip-flop (not shown) is illustrated on graph 103, a Clock Enable signal CE 111 for a typical prior art dynamic flop-flop (not shown) is illustrated on graph 115, and the voltage 121 on a dynamic node (not shown) of a typical prior art dynamic flip-flop (not shown) is illustrated on graph 125. As seen in FIG. 1, voltage 121 on a dynamic node (not shown) of a typical prior art dynamic flip-flop (not shown) repeatedly charged to pre-charge voltage 127, see points 131, 133, 135, 137, 139, 141 and 143 and discharged to discharge voltage 129, see points 151, 153, 155, 157, 159, 161 and 163. Of particular note is the fact that, in the prior art, pre-charging of a typical prior art dynamic flip-flop (not shown) took place even at points 133, 135, 137 and 139, during period 117, while Clock Enable signal CE 111 was low and when, by definition, the data was not changing. Consequently, significant power was wasted pre-charging to voltage 127 and discharging to voltage 132 the dynamic node each cycle. Consequently, as discussed above, prior art dynamic flip-flops used power unnecessarily.

Since, as noted above, a significant amount of power in modern electronic devices is used to operate the flip-flops, the power wasted in prior art dynamic flip-flop circuits was non-trivial. What is needed is a method and apparatus for avoiding the power waste created by prior art dynamic flip-flops unnecessarily pre-charging and discharging the internal dynamic node.

SUMMARY OF THE INVENTION

In general, we can't predict incoming data of flops. But for this type of flops with clock enable, when flops are in clock disable mode, the input is previous cycle data from the feedback path. We take advantage of this predictability to do power saving. The present invention is directed to a method and apparatus for creating a modified dynamic flip-flop. According to the present invention, when the modified dynamic flip-flop is in a holding mode, i.e., in the clock disable state, the modified dynamic flip-flop of the invention is placed in a pre-charge disable state and does not waste power pre-charging and discharging the internal dynamic node every cycle.

The modified dynamic flip-flop of the invention avoids the power waste created by prior art dynamic flip-flops by including a conditional pre-charge control circuit and method. In one embodiment of the invention, the conditional pre-charge control circuit includes a PMOS transistor and a NORGATE. According to one embodiment of the present invention, the PMOS transistor is controlled by NORGATE. In one embodiment of the invention, if the modified dynamic flip-flop of the invention does not need to be scanned, the inversion of the Clock Enable (CE) signal can be used to control the PMOS.

According to the present invention, the small overhead associated with the conditional pre-charge control circuit of the invention, in one embodiment an additional PMOS and an additional NORGATE, makes pre-charge conditional and saves significant power usage.

According to the present invention, when the modified dynamic flip-flop of the invention is operated in normal mode, i.e., when the Clock Enable signal is a digital "1", the modified dynamic flip-flop of the invention captures data from a data terminal at the occurrence of the clock signal's rising edge. If the data is a high or a digital "1", the dynamic node of the modified dynamic flip-flop of the invention will be discharged and the q-node will be a digital "1". According to the present invention, in normal mode, after the capture of the digital "1" at the q-node, if the Clock Enable signal changes to a digital "0", i.e., the modified dynamic flip-flop of the invention enters into the clock disable mode, the modified dynamic flip-flop of the invention will hold the previous data. Then, according to the present invention, depending on the timing of the Clock Enable signal's switch from a digital "1" to a digital "0", the signal on the dynamic node can be either a digital "0", some intermediate state between a digital "0" and digital "1", or pre-charged to a digital "1". Before the next rising edge of the clock signal, the feedback from the q-node will evaluate the modified dynamic flip-flop's dynamic node. Consequently, no matter what values are at the dynamic node, the dynamic node will be dragged down to "0" thereby keeping q-node at a constant digital "1".

Those of skill in the art will readily recognize that the normal of operation of the modified dynamic flip-flop of the invention discussed above is similar to the operation of prior art dynamic flip-flops. However, according to the present invention, and in contrast to the prior art, in clock cycles following the dynamic node being dragged down to "0", thereby keeping q-node at a constant digital "1", as discussed above, if the modified dynamic flip-flop of the invention remains in "clock disable mode", the dynamic node is not pre-charged and discharged again and again, as was done in the prior art. Instead, the dynamic node of the modified dynamic flip-flop of the invention maintains a constant low or digital "0". Consequently, the power wasted in prior art dynamic flip-flops is avoided. Of course, the more cycles the modified dynamic flip-flop of the invention holds data, the greater power savings achieved.

According to the present invention, when the modified dynamic flip-flop of the invention needs to get back to the normal mode, i.e., the Clock Enable signal switches form a digital "0" to "1", the dynamic node needs to be pre-charged to a digital "1" before the next rising edge of the clock signal. Depending on the timing of Clock Enable signal switch from a digital "0" to digital "1", the pre-charge can get started right after the falling edge of the clock signal or after some delay of the clock signal falling edge, in the latter case the pre-charge is ensured by the Clock Enable signal digital "0" to digital "1" setup time.

In one embodiment of the invention, the Clock Enable signal has the same number of stages of delay setup as the prior art dynamic flip-flop that the modified dynamic flip-flop of the invention is intended to replace. In this embodiment of the invention, the Clock Enable signal has three stages delay setup, both in the prior art and in the modified dynamic flip-flop of the invention. In this embodiment of the invention, the Clock Enable signal setup time from digital "0" to digital "1" can be chosen from the Clock Enable input pin to the end/ens node delay or timed to pre-charge.

As discussed above, according to the present invention, if sizing is properly attended to, and timing monitored, by methods well-known to those of skill in the art, the modified dynamic flip-flop of the invention can have the same digital "0" to digital "1" setup time as the prior art dynamic flip-flop that the modified dynamic flip-flop of the invention is intended to replace. Thus, the modified dynamic flip-flop of the invention can provide significant power saving without sacrificing speed.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers will be used throughout the drawings and the following description to refer to the same or like parts.

Figure 2:
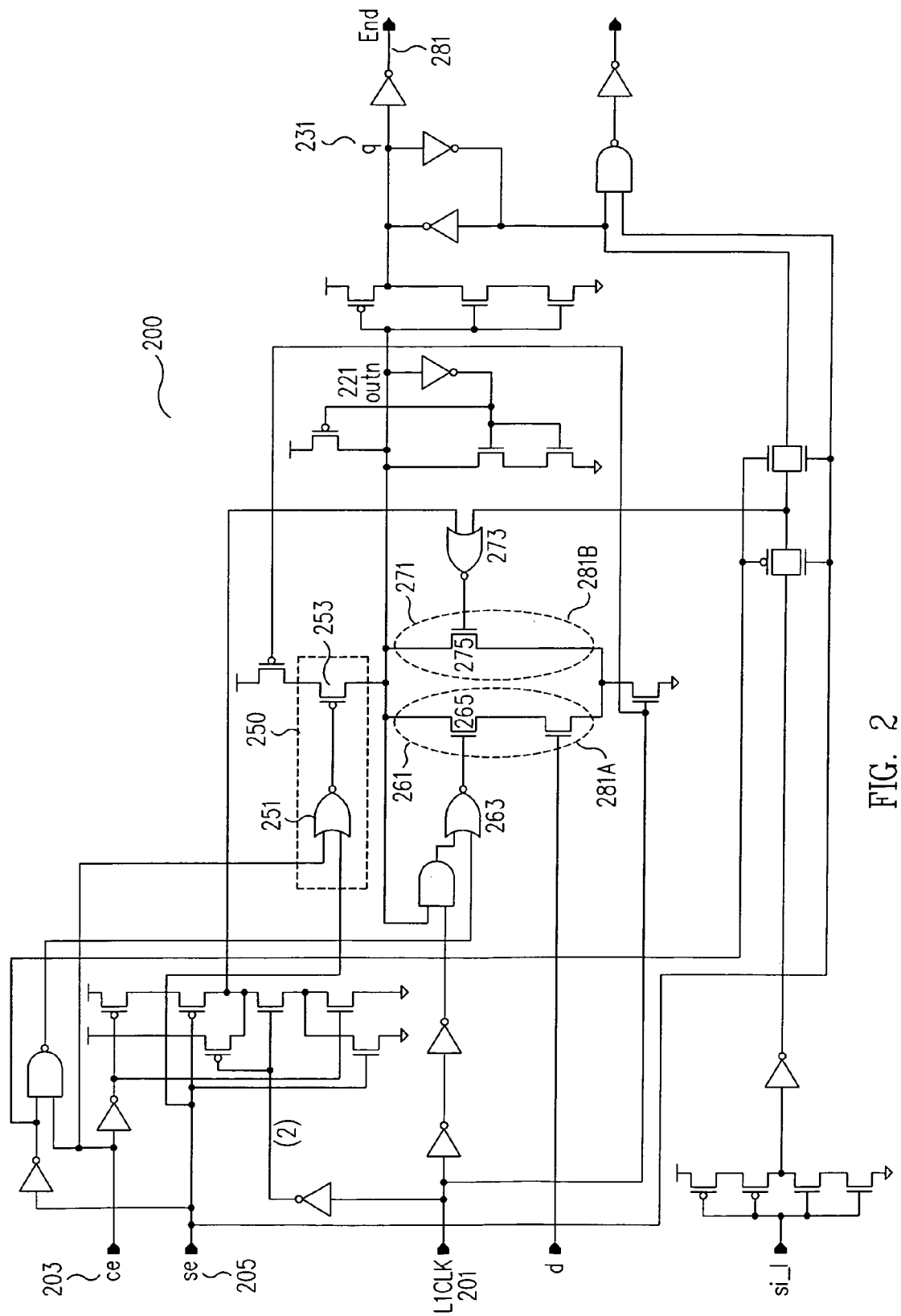
FIG. 2 shows a schematic diagram of one embodiment of a modified dynamic flip-flop designed according to the principles of the present invention.

The modified dynamic flip-flop of the invention (200 in FIG.2) avoids the power waste created by prior art dynamic flip-flops by including a pre-charge disable circuit (250 in FIG.2). In one embodiment of the invention, the pre-charge disable circuit includes a PMOS transistor (253 in FIG.2) and a NORGATE (251 in FIG.2). According to the present invention, the PMOS Transistor is controlled by a NORGATE whose inputs are the Clock Enable signal (CE 203 in FIG.2) and the Scan Enable signal (SE 205 in FIG.2). In the scan shift in and shift out operation, the PMOS transistor (253 in FIG.2) are always on since there is no clock disable mode. On the other hand, if, in one embodiment, the modified dynamic flip-flop of the invention does not need to be scanned, the inversion of the Clock Enable signal can be used to control this PMOS. When the modified dynamic flip-flop of the invention is operated in normal mode, it captures data from at L1 Clock (L1CLK 201 in FIG.2) rising edge. If the data is a digital "1", the dynamic node (OUTN 221 in FIG.2) will be discharged and the q-node (231 in FIG.2) will be a digital "1". After the capture of the digital "1", if the Clock Enable signal changes to a digital "0", which means the modified dynamic flip-flop of the invention enters into the clock disable mode, the modified dynamic flip-flop of the invention will hold the previous data.

Depending on the timing of Clock Enable signal switch from digital "1" to "0", the voltage on the dynamic node can be a digital "0", some harmless intermediate state between a digital "0" and "1", or a pre-charged digital "1".

Those of skill in the art will readily recognize that the normal of operation of the modified dynamic flip-flop of the invention discussed above is similar to the operation of prior art dynamic flip-flops. However, according to the present invention, and in contrast to the prior art, in clock cycles following the dynamic node being dragged down to "0", the modified dynamic flip-flop of the invention remains in a "pre-charge disable mode" (301 in FIG. 3) and the dynamic node is not pre-charged and discharged again and again as it was in the prior art (see point 133, 135, 137 139 and 141 in FIG. 1). Instead, the modified dynamic flip-flop of the invention maintains a digital "0" on the dynamic node. Thus the power waste of the prior art is avoided.

According to the present invention, the modified dynamic flip-flop of the invention in the pre-charge disable mode operates just like a prior art static flip-flop. However, when the modified dynamic flip-flop of the invention needs to get back to the normal mode, i.e., when the Clock Enable signal switches from a digital "0" to "1", the dynamic node needs to be pre-charged to a digital "1" before the next rising edge of the signal L1CLK.

Depending on the timing of the Clock Enable signal's switch from digital "0" to "1", the pre-charge of the dynamic node can get started right after the falling edge of the signal L1CLK or after some delay of the falling edge of the signal L1CLK. In the latter case, the pre-charge is ensured by the Clock Enable from digital "0" to "1" setup time. Thus, using the modified dynamic flip-flop of the invention, power is saved without sacrificing speed FIG. 2 shows a schematic diagram of one embodiment of a modified dynamic flip-flop 200 designed according to the principles of the present invention.

As seen in FIG. 2, modified dynamic flip-flop 200 includes pre-charge disable circuit 250. In one embodiment of the invention, pre-charge disable circuit 250 includes NORGATE 251 and PMOS 253 that is controlled by NORGATE 251. In another embodiment of the invention (not shown), if the modified dynamic flip-flop of the invention does not need to be scanned, i.e., there is no scan enable signal SE 205, the inversion of the Clock enable signal can be used to control PMOS 253.

As discussed above, in the one embodiment of the invention shown in FIG. 2, pre-charge disable circuit 250 includes only NORGATE 251 and PMOS 253 and this very small overhead makes pre-charge conditional.

According to the present invention, when the Clock Enable signal CE 203 is a digital high or digital "1", i.e., in the clock enable mode, the modified dynamic flip-flop 200 operates in normal mode and captures data at L1CLK 201 rising edge. If the data is "1", node OUTN 221, the dynamic node, will be discharged via open path 281A and node q 231 will be a digital "1".

After the capture of the digital "1" at node q 231, when the Clock Enable signal CE 203 changes to a digital "0", in the clock disable mode, modified dynamic flip-flop 200 will hold the previous data. Depending on the timing of Clock Enable signal's CE 203 switch from a digital "1" to digital "0", dynamic node OUTN 221 can be a digital "0", some harmless intermediate state between a digital "0" and digital "1" or pre-charged to a digital "1". However, before the next rising edge of signal L1CLK 201, the feedback from node q 231 will evaluate dynamic node OUTN 221. So no matter what values are at dynamic node OUTN 221, it will be dragged down to a digital "0" thereby keeping node q 231 at a digital "1".

Those of skill in the art will readily recognize that the "normal" mode operation of modified dynamic flip-flop 200 is very similar to the operation of prior art dynamic flip-flops. However, in the following cycles, if modified dynamic flip-flop 200 is still in the clock disable mode, i.e., Clock Enable signal CE 203 is still a digital "0", using the present invention, dynamic node OUTN 221 is not pre-charged and discharged repeatedly as it was in the prior art. Instead, using the present invention, dynamic node OUTN 221 remains a digital "0".

According to the present invention, dynamic node OUTN 221 remains a digital "0" when the Clock Enable signal CE 203 is a digital "0" and the previous data stored in Q 231 is a digital "1". When CE 203 is a digital "0", the output of NORGATE 263 is a digital "0". Consequently, transistor 265 is off and path 281A is shut down. In addition, when CE 203 is a digital "0", the output of NORGATE 251 is a digital "1" and PMOS 253 is therefore shut off. The feedback path through the output of NORGATE 273 evaluates the OUTN 221 to digital "0" when Q is digital "1" in next cycles. Consequently, pre-charge disable circuit 250 prevents pre-charge of dynamic node OUTN 221, so dynamic node OUTN 221 is a digital "0" all the time when Q is digital "1" and is not pre-charged and discharged repeatedly as it was in the prior art and power waste is avoided. If the previous data stored in Q is digital "0", OUTN221 will be digital "1" all the time without power waste just as the original design.

Using the present invention, the more cycles Clock Enable signal CE 203 is a digital "0", i.e., the longer modified dynamic flip-flop 200 is in the clock disable mode, the more power savings will be possible.

According to one embodiment of the present invention, when modified dynamic flip-flop 200 needs to return to the normal mode, i.e., Clock Enable signal CE 203 switches from a digital "0" to a digital "1", dynamic node OUTN 221 needs to be pre-charged to a digital "1" before the next rising edge of signal L1CLK 201. Depending on the timing of Clock Enable signal's CE 203 switch from a digital "0" to digital "1", the pre-charge of dynamic node OUTN 221 can get started right after the falling edge of L1CLK 201 or after some delay of the falling edge of L1CLK 201. According to one embodiment of the invention, this delay can be predetermined by the setup time for the Clock Enable signal CE 203 switching from a digital "0" to a digital "1". If sized and timed properly, modified dynamic flip-flop 200 can have the same setup time of Clock Enable signal CE 203 switching from a digital "0" to a digital "1" as the original design it is used to replace. Consequently, without sacrificing the speed of the flip-flop function, the power is saved.

Figure 1:
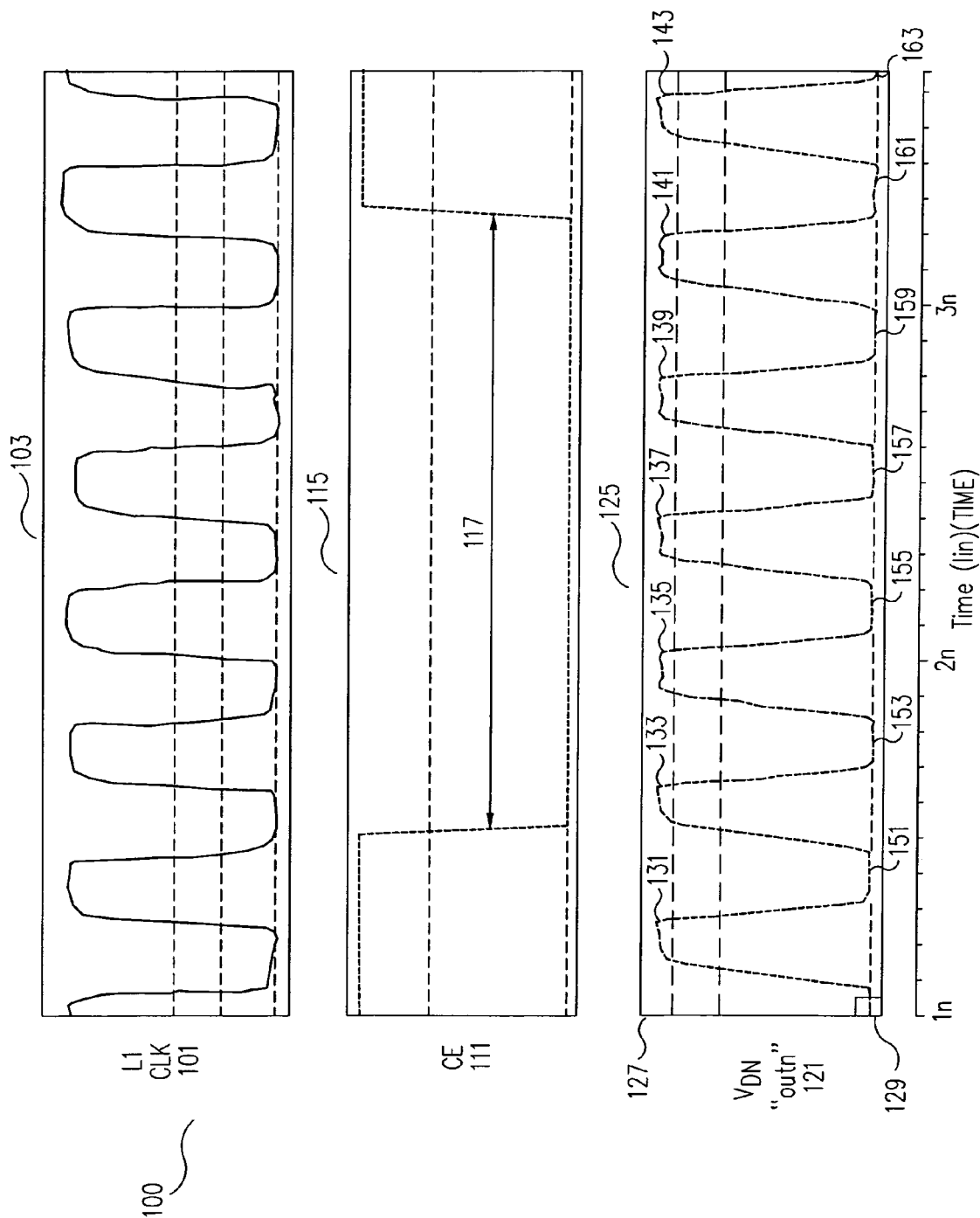
FIG. 1 shows an exemplary timing diagram for a typical prior art dynamic flip-flop.
Figure 3:
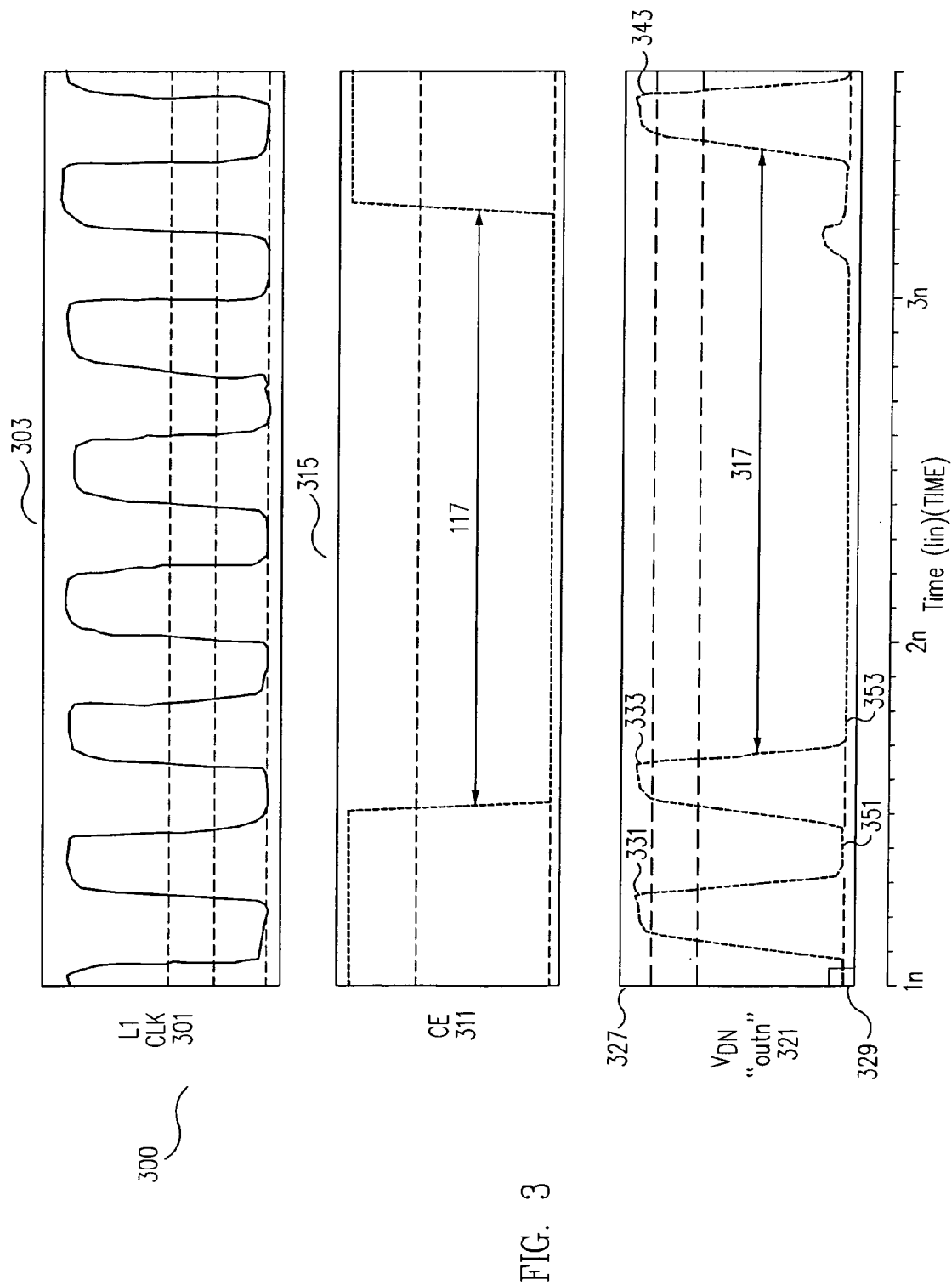
FIG. 3 is one embodiment of a timing diagram for a modified dynamic flip-flop designed according to the principles of the present invention.

FIG. 3 is a one embodiment of a timing diagram for modified dynamic flip-flop designed according to the principles of the present invention. L1 clock signal L1CLK 301 for one embodiment of a modified dynamic flip-flop designed according to the principles of the present invention, such as L1CLK 201 of modified dynamic flip-flop 200 of FIG. 2, is shown on graph 303. A Clock Enable signal CE 311 for one embodiment of a modified dynamic flip-flop designed according to the principles of the present invention, such as signal CE 203 of modified dynamic flip-flop 200 of FIG. 2, is shown on graph 315. The voltage 321 on a dynamic node for one embodiment of a modified dynamic flip-flop designed according to the principles of the present invention, such as dynamic node OUTN 221 of modified dynamic flip-flop 200 of FIG. 2, is shown on graph 325. As seen in FIG. 3, voltage 321 on a dynamic node, such as dynamic node OUTN 221 of modified dynamic flip-flop 200 of FIG. 2, only charges to pre-charge voltage 327, at points 331, 333 and 343. Referring to FIG. 1, recall that a dynamic node (not shown) of a typical prior art dynamic flip-flop (not shown) repeatedly charged to pre-charge voltage 127, at points 131, 133, 135, 137, 139, 141 and 143 in the same period.

As also shown in FIG. 3, voltage 321 on a dynamic node, such as dynamic node OUTN 221 of modified dynamic flip-flop 200 of FIG. 2, only discharges to discharge voltage 329 at points 351, 353, and 355. Referring to FIG. 1, recall that a dynamic node (not shown) of a typical prior art dynamic flip-flop (not shown) repeatedly discharged to voltage 129, at points 151, 153, 155, 157, 159, 161 and 163 in the same period. Consequently, using the method and apparatus of the present invention, a static period 317 is introduced, corresponding to period 117 of graph 315, when signal Clock Enable CE 303 is low and when, by definition, the data is not changing, wherein there is no charging, or discharging of a dynamic node, such as dynamic node OUTN 221 of modified dynamic flip-flop 200 of FIG. 2. Consequently, using the method and apparatus of the present invention, a dynamic node, such as dynamic node OUTN 221 of modified dynamic flip-flop 200 of FIG. 2, is only charged three times while, in the prior art, the dynamic node was charged seven times in the same period: a savings of over sixty percent at this node.

The significance of the power savings described above becomes quite clear when it is considered that thousands, and even millions, of flip-flops can be employed in a single electronic system.

As discussed above, the modified dynamic flip-flop of the invention avoids the power waste created by prior art dynamic flip-flops by including a conditional pre-charge control circuit and method.

According to the present invention, the small overhead associated with the conditional pre-charge control circuit of the invention, in one embodiment an additional PMOS and an additional NORGATE, makes pre-charge conditional and saves significant power usage.

As also discussed above, according to the present invention, if sizing is properly attended to, and monitored, by methods well-known to those of skill in the art, the modified dynamic flip-flop of the invention can have the same digital "0" to digital "1" setup time as the prior art dynamic flip-flop that the modified dynamic flip-flop of the invention is intended to replace. Thus, the modified dynamic flip-flop of the invention can provide significant power saving without sacrificing speed.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For example, as discussed above, for illustrative purposes specific embodiments of the invention were shown with specific components and timing. However, Those of skill in the art will readily recognize that the embodiments of a modified flip-flop circuit shown in the FIGS. are merely one example of implementations of the present invention. Those of skill in the art will also recognize that numerous types of modified high-speed flip-flop circuits, employing various numbers and types of components, could be used to effect the same result. Therefore, the present invention should not be construed as being limited to the exemplary embodiments of a modified high-speed flip-flop circuit designed according to the invention shown in the FIGS.

Consequently, the scope of the invention is defined by the claims and their equivalents.

What is claimed is:

1. A method for providing a modified dynamic flip-flop comprising:
   providing a dynamic flip-flop, said dynamic flip-flop having a normal mode of operation and a pre-charge disable mode of operation;
   coupling a pre-charge disable circuit to said dynamic flip-flop, wherein;
   said pre-charge disable circuit causes said modified dynamic flip-flop to operate in said pre-charge disable mode; and
   providing a clock enable signal, wherein;
   said pre-charge disable circuit causes said modified dynamic flip-flop to operate in said pre-charge disable mode whenever said clock enable signal is in a first digital state, further wherein;
   said pre-charge disable circuit comprises at least a logic GATE; further
   wherein:
      said logic gate of said pre-charge disable circuit is a NORGATE.

2. A modified dynamic flip-flop comprising:
   a dynamic flip-flop;
      a pre-charge disable circuit coupled to said dynamic flip-flop, wherein;
   said pre-charge disable circuit causes said modified dynamic flip-flop to operate in a pre-charge disable mode such that said dynamic flip-flop has a normal mode of operation and a pre-charge disable mode of operation;
   a clock enable signal coupled to said modified dynamic flip-flop, wherein;
   said pre-charge disable circuit causes said modified dynamic flip-flop to operate in said pre-charge disable mode whenever said clock enable signal is in a first digital state, further wherein;
   said modified dynamic flip-flop operates in said normal mode when said clock enable signal is in a second digital state, further wherein:
      said pre-charge disable circuit comprises at least a logic GATE; further
   wherein:
      said logic gate of said pre-charge disable circuit is a NORGATE.

3. The method for providing a modified dynamic flip-flop of claim 1 wherein:
   said first digital state is a digital low state.

4. The method for providing a modified dynamic flip-flop of claim 1 wherein:
   said first digital state is a digital low state and said second digital state is a digital high state.

5. The modified dynamic flip-flop of claim 2 wherein:
   said first digital state is a digital low state.

6. The modified dynamic flip-flop of claim 2 wherein:
   said first digital state is a digital low state and said second digital state is a digital high state.

* * * * *